United States Patent [19]
Walker et al.

[11] Patent Number: 6,088,760
[45] Date of Patent: Jul. 11, 2000

[54] ADDRESSING SYSTEM IN A MULTI-PORT RAM HAVING MAIN AND CACHE MEMORIES

[75] Inventors: Robert M. Walker, Rougemont; Stephen Camacho, Durham; Rhonda Cassada, Hillsborough, all of N.C.

[73] Assignee: Mitsubishi Semiconductor America, Inc., Durham, N.C.

[21] Appl. No.: 09/018,343

[22] Filed: Feb. 4, 1998

Related U.S. Application Data

[60] Provisional application No. 60/040,053, Mar. 7, 1997.

[51] Int. Cl.[7] .............................. G06F 12/02; G06F 13/00
[52] U.S. Cl. ............................ 711/104; 711/118; 711/154
[58] Field of Search ..................................... 711/104, 154, 711/118

[56] References Cited

U.S. PATENT DOCUMENTS

5,544,121  8/1996  Dosaka et al. ........................... 365/222
5,546,343  8/1996  Elliott et al. ......................... 365/189.04
5,561,781  10/1996  Braceras et al. ..................... 711/149 X
5,566,318  10/1996  Joseph ..................................... 711/118

*Primary Examiner*—David Robertson
*Attorney, Agent, or Firm*—Burns, Doane, Swecker & Mathis, L.L.P.

[57] ABSTRACT

A multi-port memory chip having a DRAM main memory and a SRAM cache memory coupled via a global bus. An addressing system enables the user to perform data transfers between external data ports and the SRAM concurrently with data transfers between the DRAM and the SRAM. To support DRAM operations, DRAM address pins on the memory chip select a data block in the DRAM, and indicates a SRAM line for receiving or transferring data. To support SRAM operations, SRAM address pins determine addressed line and word in the SRAM. To reduce the number of pins on the memory chip the DRAM address pins and SRAM address pins are used for supplying commands that define various memory operations.

18 Claims, 6 Drawing Sheets

| NO. | NAME (FUNCTION) | /RAS | /CAS | ADD <10:9> | ADD <8:7> | ADD <6:5> | ADD <4:0> | BA <1:0> |
|---|---|---|---|---|---|---|---|---|
| 1 | DNOP (DRAM NO OPERATION) | H | H | X | X | X | X | X |
| 2 | PRE (PRECHARGE DRAM BANK) | L | H | LL | X | LL | X | V |
| 3 | PREA (PRECHARGE ALL BANKS) | L | H | LL | X | LH | X | X |
| 4 | ACT (ACTIVATE DRAM PAGE) | L | H | HH | RA | RA | RA | V |
| 5 | DRT (DRAM BLOCK -> SRAM LINE) | H | L | S | S | LL | CA | V |
| 6 | DWT (SRAM LINE -> DRAM BLOCK) | H | L | S | S | HL | CA | V |
| 7 | DMT (SRAM LINE -> DRAM BLOCK W/ BWE MASK) | H | L | S | S | HH | CA | V |
| 8 | ARF (AUTO REFRESH (MUST BE EXECUTED 8096 TIMES IN 64ms TO REFRESH THE DRAM) | L | L | X | X | LL | X | X |
| 9 | SMR (SET MODE REGISTER) | L | L | X | X | HL | MRC | X |

CA = COLUMN ADDRESS (1 OF 32)  
S = SRAM LINE SELECT (1 OF 16)  
V = VALID ADDRESS  
RA = ROW ADDRESS (1 OF 512)  
CMD = COMMAND  
MRC = MODE REGISTER COMMAND

FIG. 7

ADDRESSING SYSTEM IN A MULTI-PORT RAM HAVING MAIN AND CACHE MEMORIES

This application claims the benefit of U.S. Provisional Application Ser. No. 60/040,053 filed Mar. 7, 1997.

FIELD OF THE INVENTION

This application relates to memory devices, and in particular, to an addressing system in a multi-port random access memory (MPRAM).

BACKGROUND ART

The development of a computer graphics system creates the need for fast memories capable of storing huge amounts of data, such as 3-D graphics data. Among such memories are cached memories developed to improve DRAM main memory performance by utilizing a faster SRAM cache memory for storing the most commonly accessed data. For example, U.S. Pat. No. 5,566,318 discloses a cached DRAM that integrates a SRAM cache memory with a DRAM on a single chip. Sense amplifiers and column write select registers are coupled between the SRAM cache and the DRAM memory array. A column decoder is associated with the SRAM cache for providing access to the desired column of the SRAM. A row decoder is associated with the DRAM memory array to enable access to particular rows of the DRAM. Input/output control and data latches receive data from the SRAM to provide data output via data input/output lines. The current row of data being accessed from the DRAM memory array is held in the SRAM cache memory. Should a cache "miss" be detected, the entire cache memory is refilled from the DRAM memory array over a DRAM-to-cache memory bus.

In a conventional cached DRAM, separate pins are used to provide address and command signals. In particular, command pins are required to issue commands for supporting DRAM and SRAM operations. For example, a precharge pin may be used for supplying a DRAM row precharge command, a refresh pin may be used to provide a command for refreshing the DRAM. Separate pins may be used to define type and length of a data burst in a burst mode of operation. Also, several pins may be required to control masking and to provide mask data for masked write operations.

To minimize the number of pins on a cached RAM chip, it would be desirable to use address pins for supplying commands.

DISCLOSURE OF THE INVENTION

Accordingly, the principal advantage of the invention is in providing a multi-port memory chip having address pins used for supplying commands.

The above and other advantages of the present invention are achieved, at least in part, by providing a memory chip that comprises at least one external data port for providing data input and output, a main memory for storing data, and a cache memory coupled between the data port and the main memory. Address pins are arranged on the chip to provide address information for performing data transfer between the main memory and the cache memory concurrently with and independently of data transfer between the data port and the cache memory. The address pins are supplied with control values for providing commands to execute various operations.

In accordance with a preferred embodiment of the invention, the address pins include the cache memory address pins and the main memory address pins. In particular, the main memory address pins may supply a precharge command for deactivating a single bank or all banks of the main memory.

Further, the main memory address pins may define a main memory read transfer command for transferring a data block from the main memory to a line in the cache memory. In a read transfer mode, the main memory address pins may further indicate the data block to be transferred from the main memory, and the line for receiving the data block from the main memory.

Also, the main memory address pins may define a main memory write transfer command for transferring data from a line in the cache memory to a data block in the main memory. In a write transfer mode, the main memory address pins may indicate the line from which data is transferred, and the data block selected for receiving the data from the cache memory.

Moreover, the main memory address pins may provide a set mode register command for indicating type and length of a data burst in a burst mode of operation.

In addition to providing address signals, the cache memory address pins may define a load mask register command for loading mask data into mask registers.

Still other objects and advantages of the present invention will become readily apparent to those skilled in this art from the following detailed description, wherein only the preferred embodiment of the invention is shown and described, simply by way of illustration of the best mode contemplated of carrying out the invention. As will be realized, the invention is capable of other and different embodiments, and its several details are capable ot modifications in various obvious respects, all without departing from the invention. Accordingly, the drawings and description are to be regarded as illustrative in nature, and not as restrictive.

BEST MODE FOR CARRYING OUT THE INVENTION

Figure 1:
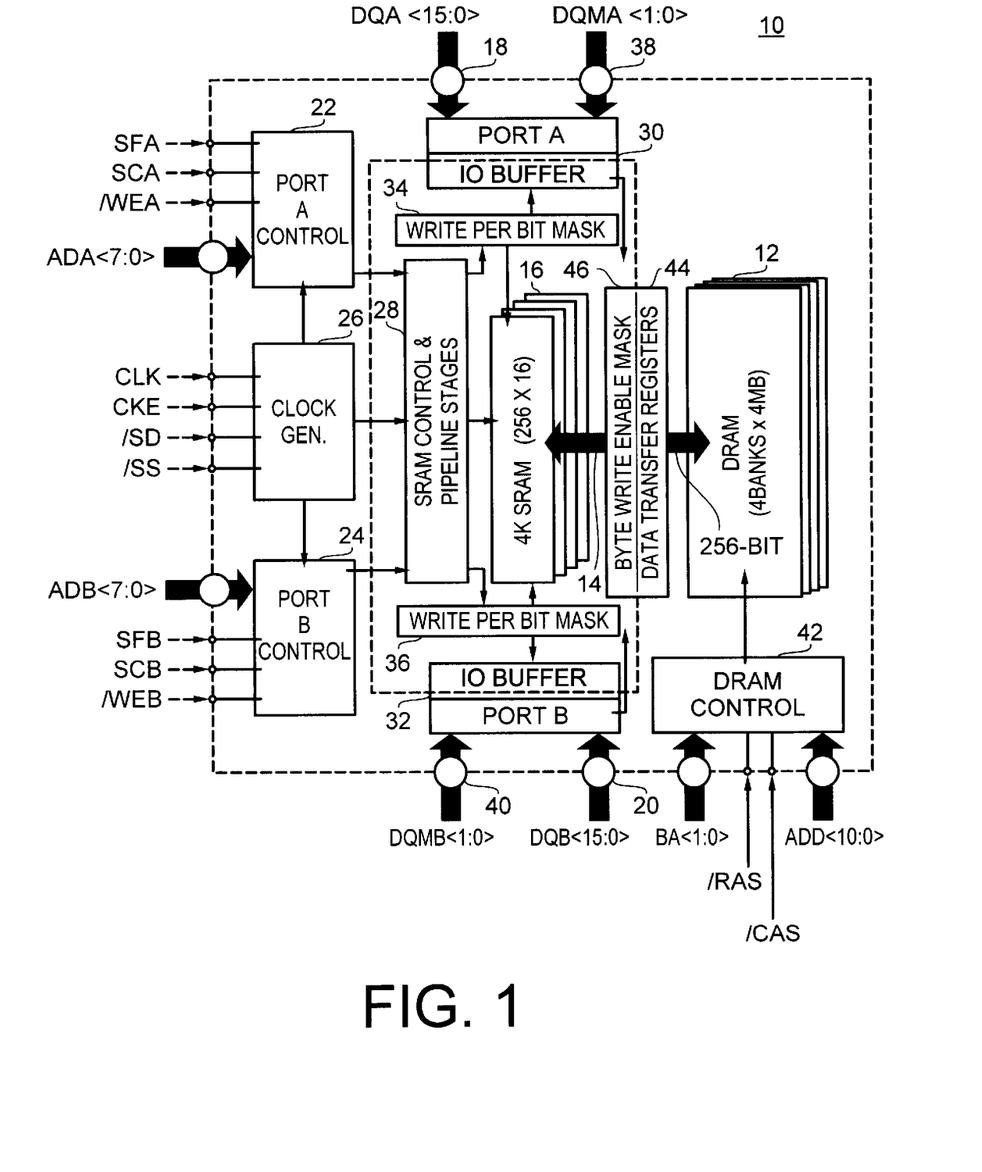
FIG. 1 is a block diagram illustrating architecture of a multi-port RAM chip of the present invention.

Although the invention has general applicability in the field of memory devices, the best mode for practicing the invention is based in part on the realization of a multi-port RAM (MPRAM) 10 illustrated in FIG. 1. The MPRAM 10 arranged on a single chip comprises a DRAM 12 divided into four independently addressable memory banks of 4 Mbits each. Each bank contains a memory array organized as 512 rows by 32 columns by 256 bits. A single 256-bit global input-output (10) bus 14 is shared by all 4 banks, of the DRAM 12, and connects the DRAM 12 to a SRAM 16.

The 4-kbit SRAM 16 may be organized as 16 lines by 16 words by 16 bits. Each 256-bit transfer between the DRAM 12 and the SRAM 16 replaces or updates one of 16 lines in the SRAM 16.

The MPRAM 10 has two identical and independent 16-bit IO ports A and B. Each of the ports A and B provides read and write accesses to each cell of the SRAM 16. IO data pins 18 and 20 are respectively connected to the ports A and B for providing input and output of 16-bit data DQA and DQB. An external 16-bit IO bus may be connected to each of the data pins 18 and 20 for writing and reading data to and from the MPRAM 10.

SRAM control signals SCA and SCB for the ports A and B, respectively, are supplied via a port A control circuit 22 and a port B control circuit 24 to define SRAM operations such as data read or write, and burst termination. Write enable commands /WEA and /WEB for the ports A and B are provided via the port control circuits 22 and 24, respectively, to decode SRAM write operations. Also, the port control circuits 22 and 24 may receive special function commands SFA and SFB, respectively, for enabling a write per bit mode of operation, and to provide burst termination.

A clock generator 26 supplied with a master clock signal CLK provides internal clocks for MPRAM operations. All input signals of the MPRAM are referenced to the rising edge of the master clock CLK. A master clock enable signal CKE is fed into the clock generator 26 to enable the internal clock generation. Chip select signals /SD and /SS provide chip select functions for the DRAM 12 and the SRAM 16, respectively.

The port control circuits 22 and 24, and the clock generator 26 are coupled to a SRAM control circuit 28 that controls write and read accesses to the SRAM 16. The data transfer path between each of the IO data pins 18 and 20 and the SRAM 16 for data writing or reading is arranged as a two-stage pipeline.

To write data into the SRAM 16, write commands WA and WB for ports A and B, respectively, may be issued by the SRAM control circuit 28 on the first clock cycle, and the data to be written is supplied on the second clock cycle. The addressed line and word of the SRAM 16 is determined by 8-bit address signals ADA and ADB for ports A and B, respectively, supplied to the port control circuits 22 and 24. For example, the addressed line may be defined by four high-order bits of the address signals ADA and ADB, and the addressed 16-bit word may be determined by four low-order bits of the address signals ADA and ADB.

For reading data from the SRAM 16, read commands RA and RB may be issued by the SRAM control circuit 28 on the first clock cycle, the data is accessed at the second clock's rising edge, and the data is made valid on the third clock cycle. Similarly to writing operations, the addressed line and word of the SRAM 16 is determined by the address signals ADA and ADB for ports A and B, respectively. For example, the addressed line may be defined by four high-order bits of the address signals ADA and ADB, and the addressed 16-bit word may be determined by four low-order bits of the address signals ADA and ADB.

Ports A and B are independent and may simultaneously provide reading and writing data from or to any location in the SRAM 16. However, the user is prevented from writing to the same SRAM cell from both ports simultaneously. IO buffers 30 and 32 are coupled to the ports A and B, respectively, to buffer data during read and write operations.

Write per bit mask registers 34 and 36 connected to the IO buffers 30 and 32, respectively, are used to perform masked write operations from ports A and B. The SRAM control circuits issue masked write commands MWA and MWB for ports A and B, respectively, to mask the DQA and DQB data being read from the SRAM 16 or written into the SRAM 16. Pins 38 and 40 supply two-bit mask control data DQMA and DQMB for ports A and B, respectively. When either bit of the mask control data DQMA and DQMB is set high, the DQA and DQB data, respectively, being read or written is masked. For example, the high-order bit of the mask control data DQMA and DQMB respectively controls the upper byte of the DQA and DQB data. The low-order bit of the mask control data DQMA and DQMB may respectively control the lower byte of the DQA and DQB data. Load mask register commands LMRA and LMRB may be issued by the SRAM control circuit 28 for ports A and B, respectively, to load the write per bit registers 34 and 36.

The MPRAM 10 allows the SRAM 16 and DRAM 12 to operate concurrently. A DRAM control circuit 42 forms DRAM control commands defined by control signals /RAS and /CAS. A 2-bit bank address command BA selects one of four DRAM banks. An 11-bit address command ADD selects DRAM row and column addresses, DRAM transfer operations and lines in the SRAM 16 from which data may be transferred to the DRAM 12 or to which data may be transferred from the DRAM 12. For example, nine low-order bits of the ADD command may select DRAM row address, five low-order bits may select DRAM column address, two bits of the ADD command may be used to define DRAM transfer operations, and four high-order bits may select one of sixteen lines in the SRAM.

The DRAM control circuit 42 forms a DRAM read transfer command DRT to transfer 1 of 32 blocks of data indicated by the ADD command into 1 of 16 lines in the SRAM 16. A DRAM write transfer command DWT is formed by the DRAM control circuit 42 to transfer data from 1 of 16 SRAM lines indicated by the ADD command to 1 of 32 blocks in the DRAM 12.

Data transfer registers 44 are arranged between the DRAM 12 and SRAM 16 to support data transfer between the DRAM 12 and SRAM 16. A 32-bit byte write enable mask register 46 is used to mask DRAM write transfers. The register 46 may be loaded from either port A or port B when the load mask register command LMR is issued. Each bit in the register 46 masks a byte of the 256-bit global IO bus 14. The byte write enable mask register 46 and write per bit mask registers 34 and 36 may be bypassed during writes to the DRAM 12 and SRAM 16, respectively. Data transfers between the SRAM 16 and the DRAM 12 via the global 10 bus 16 are disclosed in more detail in our copending application Ser. No. 08/937,004 entitled "MULTI-PORT RAM HAVING SHARED GLOBAL BUS" filed on Sep. 24, 1997 and incorporated herewith by reference.

The MPRAM 10 has a programmable burst mode that allows the user to select burst lengths of 1, 2, 4 and 8 for bursts of data being written from the ports A and B to the SRAM 16 or bursts of data being read from the SRAM 16 to the ports A and B. Sequential or interleave bursts may be selected. A set mode register command SMR issued by the DRAM control circuit 42 enables the burst length and type to be programmed in an internal mode register. A mode register code (MRC) to be programmed in the mode register may be entered using the ADD command. The MRC is stored in the mode register until it is overwritten by the next SMR command, or until power is no longer supplied to the MPRAM 10. The SMR command may be issued when the DRAM 12 and SRAM 16 are in an idle state. Burst terminate commands BTA and BTB may be issued by the SRAM control circuit 28 to terminate burst sequences from or to the ports A and B, respectively.

Figure 2:
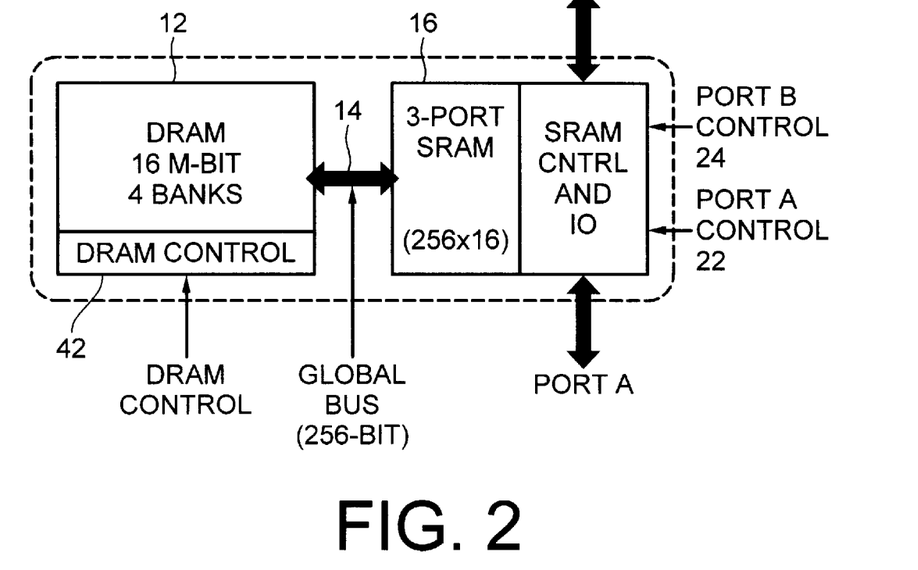
FIG. 2 is a block-diagram schematically illustrating an arrangement for controlling DRAM and SRAM data transfers.

FIG. 2 illustrates an interface between the DRAM 12 and SRAM 16 in the MPRAM 10. The SRAM 16 is organized as 16 lines with 265 bits in each line, and has two "external" IO ports for enabling access by an external device via ports A and B, and one "internal" 10 port coupled to the DRAM 12 via the global bus 14. This arrangement allows the MPRAM 10 to perform read and write accesses to the SRAM 16 from both ports A and B simultaneously with read and write accesses to the DRAM 12 via the global bus 14. The stricture of the SRAM 16 is disclosed in more detail in our copending application SN 08/936,431, entitled "MULTI-PORT RAM HAVING TRIPLE-PORT SRAM CELLS" filed on Sep. 24, 1997 and incorporated herewith by reference.

Data transfers between ports A and B, and the SRAM 16 are controlled by port A and port B control circuits 22 and 24, respectively, via SRAM control circuitry. Data transfers between the SRAM internal port and the DRAM 12 are controlled by DRAM control signals supplied via the DRAM control circuit 42.

Figure 3:
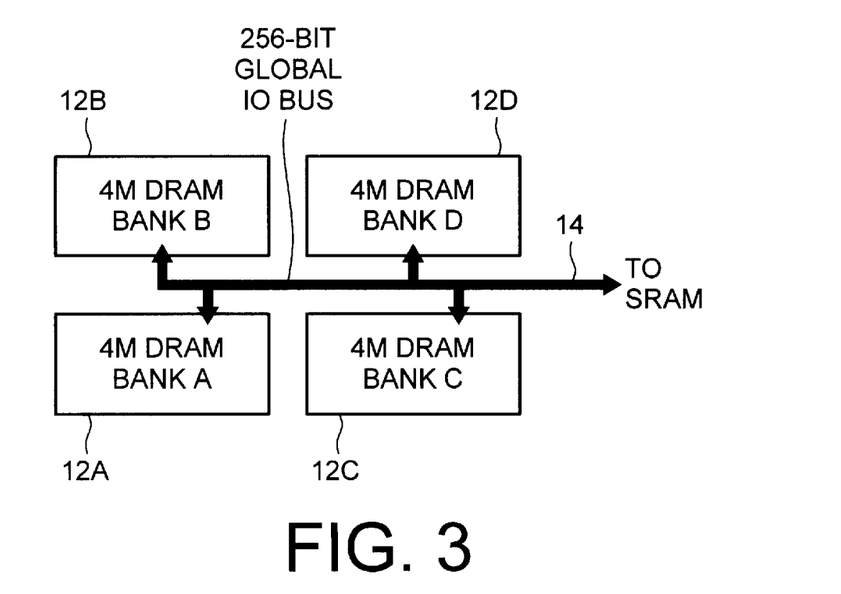
FIG. 3 is a block-diagram illustrating a multi-bank DRAM arrangement.

As shown in FIG. 3, the DRAM 12 is composed of four separately addressable 4 M-bit DRAM banks 12A, 12B, 12C and 12D coupled to the common global bus 14, which provides bi-directional data transfer between each of the DRAM banks 12A–12D and the SRAM 16. Each 4 M-bit DRAM bank contains a memory array organized as 512 rows by 32 columns. Accordingly, 512 pages are provided in each bank. Each page has 32 data blocks, each of which includes 256 bits. Thus, each page contains 8 K bits.

The global bus 14 can transfer a 256 bit of data in one writing or reading cycle. Thus, a 256-bit block of data from the DRAM 12 may be read to the SRAM 16 or written from the SRAM 16 in one DRAM cycle.

When a DRAM write cycle occurs, a 256-bit block of data is loaded from the SRAM 12 onto the global bus 14 which transfers the data block to a selected 256-bit DRAM page indicated by the DRAM column address. The selected page is located in the DRAM bank indicated by the bank address BA.

During a DRAM read transfer, a 256-bit data block indicated by the row and column addresses is read from a DRAM bank 12A–12D selected by the bank address, and placed on the global bus 14 which transfers the data block to the selected SRAM line.

Figure 4:
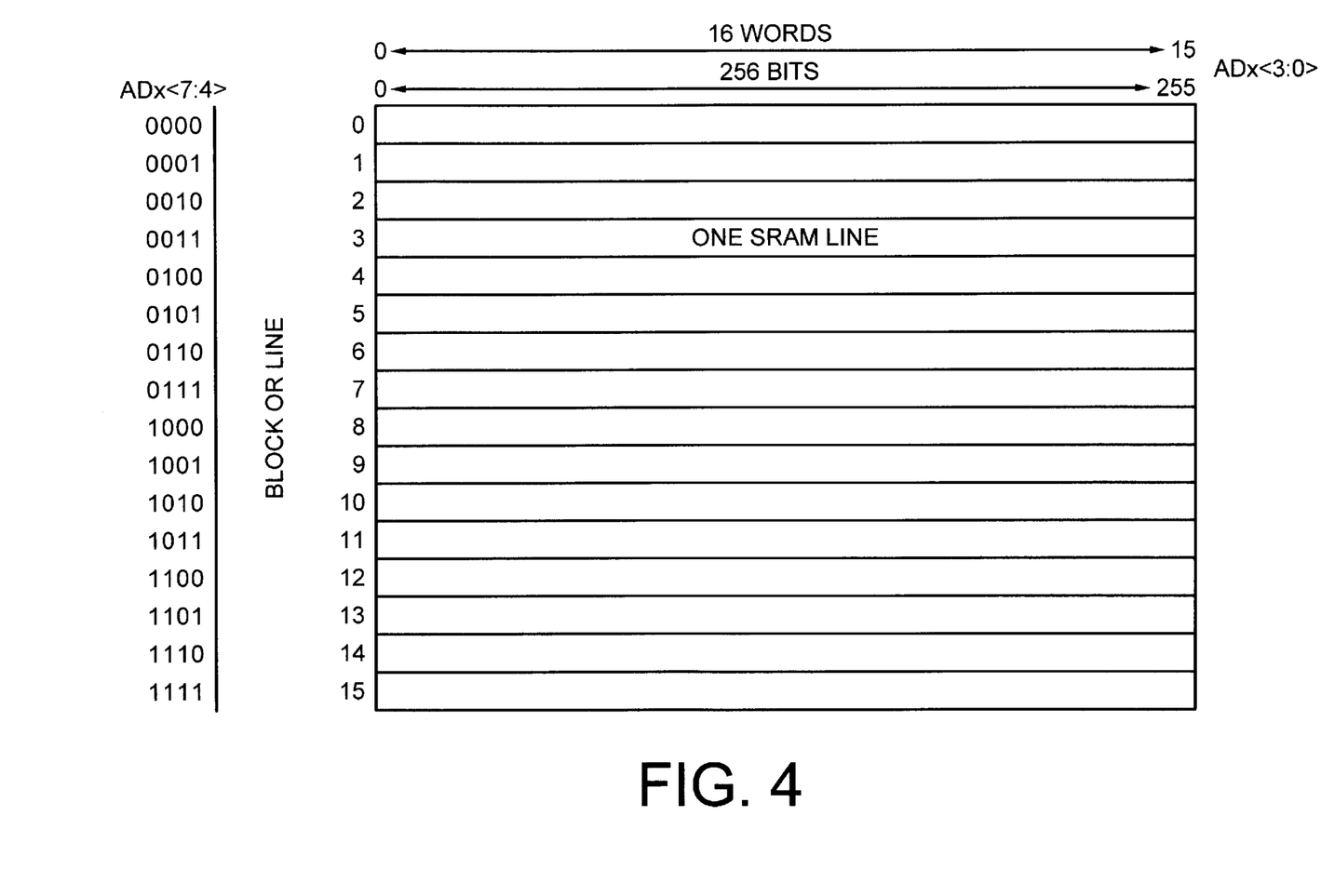
FIG. 4 is a diagram illustrating a SRAM arrangement.

As shown in FIG. 4, the 4K-bit SRAM 16 is organized to be capable of storing 256 bits of data in each of its 16 lines. Thus, each SRAM line stores a data block composed of sixteen 16-bit words. During a read transfer from DRAM 12 to the SRAM 16, a block of data from the DRAM 12 replaces an entire line in the SRAM 16. When a write DRAM transfer is performed, the entire SRAM line is written into the DRAM 12. Some bits of the SRAM lines may be masked out to prevent their transfer to the DRAM 12.

To write data into the SRAM 16 from ports A and B, write commands WA and WB, respectively, may be issued by the SRAM control circuit 28. The addressed line and word of the SRAM 16 is determined by 8-bit address signals ADA and ADB for ports A and B, respectively, supplied to the port control circuits 22 and 24. For example, the addressed line may be defined by four high-order bits of the address signals ADA and ADB, and the addressed 16-bit word may be determined by four low-order bits of the address signals ADA and ADB.

For reading data from the SRAM 16 to ports A and B, read commands RA and RB, respectively, may be issued by the SRAM control circuit 28. Similarly to writing operations, the addressed line and word of the SRAM 16 is determined by the address signals ADA and ADB for ports A and B, respectively. For example, the addressed line may be defined by four high-order bits of the address signals ADA and ADB, and the addressed 16-bit word may be determined by four low-order bits of the address signals ADA and ADB.

Each of the ports can be used as a read-only port, a write-only port, or a read-write port depending on the system requirements. For example, one of the ports can be used for reading data from the SRAM 16, while the other port may provide writing data to the SRAM 16. Read access to the SRAM 16 from one port, and write access to the SRAM 16 from the other port can be performed simultaneously in the same clock cycle.

FIGS. 5A–5I are timing diagrams illustrating DRAM and SRAM concurrent operations. The clock generator 26 supplied with the master clock signal CLK provides an internal clock signal shown in FIG. 5A. The MPRAM 10 may be a synchronous memory in which all commands are decoded on the rising edge of the internal clock. For example, an SRAM write or read operation performed via the port A or port B may take one clock cycle, a DRAM write or read operation may require 4 clock cycles for transfers via the global bus 14.

Figure 5A:
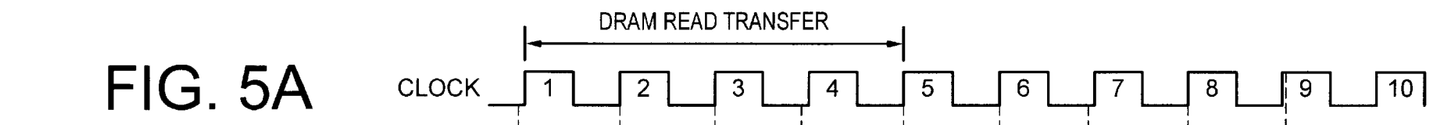
FIGS. 5A–5I are timing diagrams illustrating DRAM and SRAM data transfers.
Figure 5B:
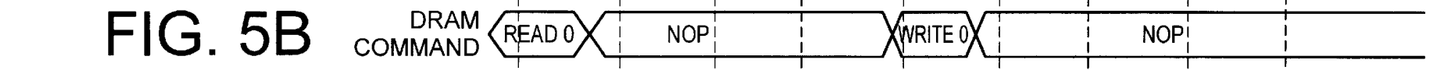

As shown in the example illustrated in FIG. 5B, a DRAM read command is issued on clock cycle 1. The bank and column addresses are also issued at this time. It is assumed that the selected DRAM bank has been activated. A selected 256-bit data block 0 is read from the selected DRAM bank and placed onto the 256-bit global bus 14.

Figure 5C:
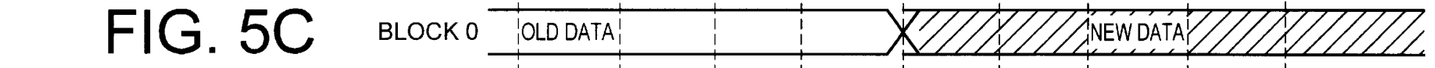

As shown in FIG. 5C, on clock cycle 5, the selected data block 0 is written into the corresponding line of the SRAM 16. Thus, after 4 cycles of the DRAM read operation, the selected block of new data replaces old data stored at this address.

Figure 5D:
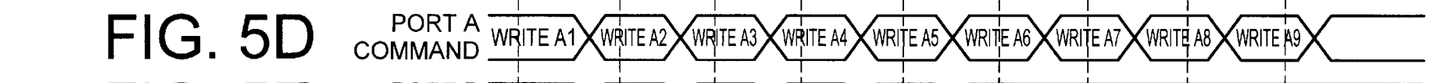

As shown in FIG. 5D, during the time when the data block 0 is being transferred from the DRAM 12 to the SRAM 16, the port A continues the issuance of SRAM write command Write A1, and issues 4 new SRAM write commands Write A2, Write A3, Write A4 and Write A5. As shown in FIG. 5G, these write commands result in supplying 16-bit words A1, A2, A3, A4 and A5 to the port A IO bus coupled to the SRAM 16. As illustrated in FIG. 6F, the words A1, A2, A3, A4 and A5 may be written, for example, to portion A of the line 3 in the SRAM 16.

Figure 5E:
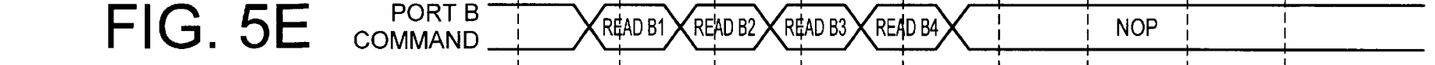
Figure 5F:
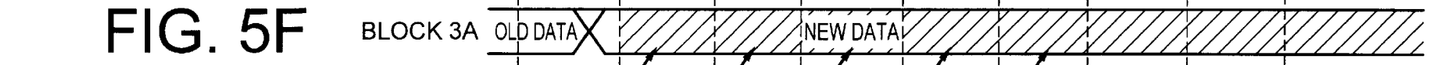
Figure 5G:
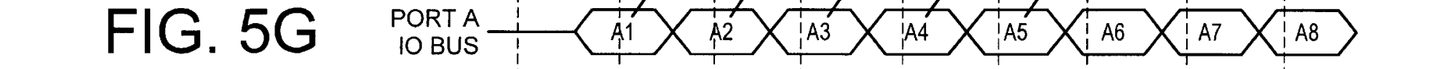
Figure 5H:
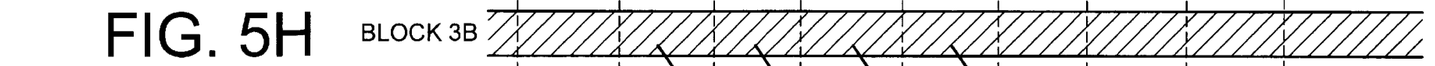
Figure 5I:
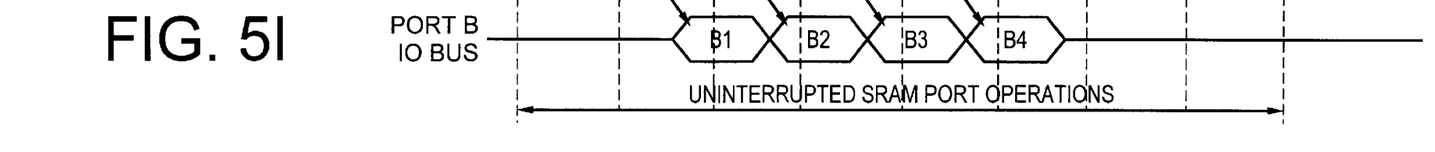

Further, as shown in FIG. 5E, during the time when the data block 0 is being transferred from the DRAM 12 to the SRAM 16, the port B issues 4 SRAM read commands Read B1, Read B2, Read B3 and Read B4. As illustrated in FIGS. 5H–5I, these read commands may result, for example, in transferring 16-bit words B1, B2, B3 and B4 from portion B of line 3 in the SRAM 16 to the port B I/O bus.

Thus, writing and reading data to and from the SRAM 160 via the ports A, and B may be carried out simultaneously with data transfers between the DRAM 120 and SRAM 160 via the global bus 14. DRAM read and write operations and data transfers between the DRAM 120 and the SRAM 160 do not interrupt SRAM read and write operations performed via the ports A and B. Once a data block read from the DRAM 120 to the SRAM 160 becomes valid, it can be immediately read from the SRAM 160 via the port A or port B.

As discussed above, the MPRAM 10 has eleven DRAM address pins ADD<10:0> that represent an 11-bit address ADD used to select DRAM row and column addresses and to support DRAM transfer operations. Two bank select pins BA<1:0> represent a 2-bit bank address BA used for selecting one of four DRAM banks. Eight SRAM address pins support SRAM operations for each of ports A and B. In particular, SAM address pins ADA<7:0> represent an 8-bit address for SRAM access from port A, and SRAM address pins ADB<7:0> carry an 8-bit address to support SRAM operations performed from port B.

Figure 6:
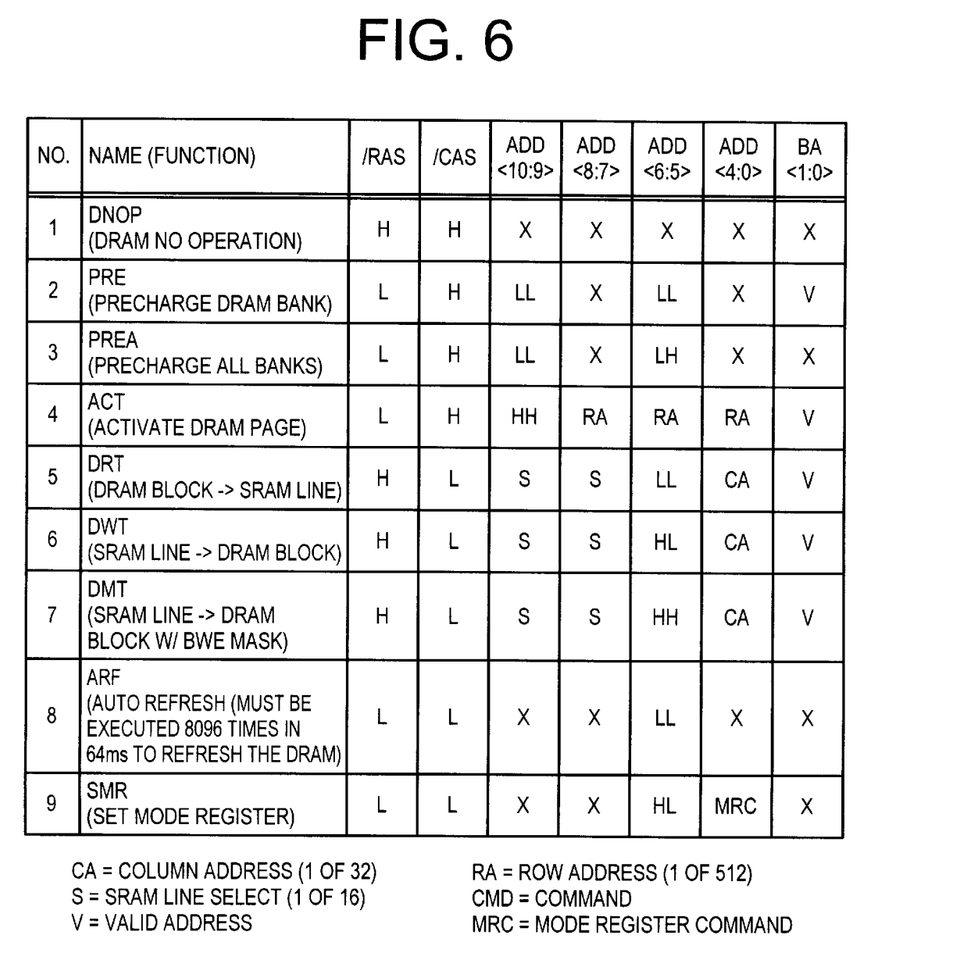
FIG. 6 is a truth table illustrating DRAM operations.

In accordance with the present invention, the address pins ADD, ADA and ADB are used not only for addressing the DRAM 12 and the SRAM 16, but also for carrying various commands issued to support DRAM and SRAM operations. FIG. 6 shows a truth table for DRAM operations in the MPRAM 10. The truth table illustrates logic values supplied to address pins ADD<10:9>, ADD<8:7>, ADD<6:5>, ADD<4:0> and BA<1:0> for supporting various DRAM operations.

When no DRAM command is issued, the control signals /RAS and /CAS are set to a high level (H) to establish a no-operation mode of the DRAM 12. The symbol X in the truth table indicates a "don't care" state of the corresponding address pins, in which they are not required to supply address or command signals. For example, in a no-operation mode of the DRAM 12, pins ADD<10:0>, and BA<1:0> are in a "don't care" state.

To deactivate a single bank of the DRAM 12, a precharge command PRE is issued. This command is represented by low levels (L) at the address pins ADD<10:9>, and ADD<6:5>. Pins ADD<8:7>, and ADD<6:5> are in a don't care state. Pins BA<1:0> indicate a valid address (V) for selecting the DRAM bank.

To deactivate all DRAM banks at once, a precharge command PREA is issued. To define the PREA command, address pins ADD<10:9> and ADD<6> are set to low levels. However, address pin ADD<5> is set to a high level (H). As no bank address is required, pins BA<1:0> are in a don't care state.

A command ACT activates a row in the idle DRAM bank indicated by the valid bank address at the pins BA<1:0>. For example, each DRAM bank may have 512 row addresses. Pins ADD<8:0> may be used to indicate a 9-bit address RA of the row to be activated. Both of unused address pins ADD<10:9> may be set to a high level to define the ACT command.

A DRAM read transfer (DRT) command is used for transferring one of 32 blocks of data from the DRAM 12 to one of 16 lines in the SRAM 16. Address pins ADD<10:7> may indicate a 4-bit address S of the SRAM line selected for receiving the data block. Address pins ADD<4:0> may represent a 5-bit column address CA that indicates the data block selected in the DRAM 12. Both address pins ADD<6:5> may be set to a low level to define the DRT command.

A DRAM write transfer (DWT) command is provided to transfer data from one of 16 lines in the SRAM 16 to one of 32 blocks in the DRAM 12. Address pins ADD<10:7> may indicate a 4-bit address S of the SRAM line selected for transferring data. Address pins ADD<4:0> may represent a 5-bit column address CA that the data block selected for receiving the data.

To define the DWT command, pin ADD<6> may be set to a high level, whereas pin ADD<5> may be set to a low level.

To define a DRAM masked transfer (DMT) command which uses the mask byte enable register 46 for masking a byte of data transferred via the global bus 14, both address bits ADD<6:5> are set to a high level. Similarly to the DWT operations, address pins ADD<10:7> may indicate an address S of the selected SRAM line, and address pins ADD<4:0> may represent a column address CA indicating the selected data block.

An auto-refresh (ARF) command is used to refresh one row of the DRAM 12. To support data storage in the DRAM 12, auto-refresh operations must be performed 8096 times during a 64 ms time period. The address of the row to be refreshed is generated in the DRAM control circuit 42. Both address pins ADD<6:5> may be set to a low level to represent the ARF command.

A set mode register (SMR) command is issued to control MPRAM operations in a programmable burst mode. The DRAM control circuit 42 may contain programmable mode registers set with the SMR command and supplied with a 5-bit mode register code (MRC) that defines burst type and length. The SMR command may be represented by a low level at pin ADD<5>, and a high level at pin ADD<6>. Address pins ADD<4:0> may carry a 5-bit MRC value to be written in the programmable mode registers.

Figure 7:
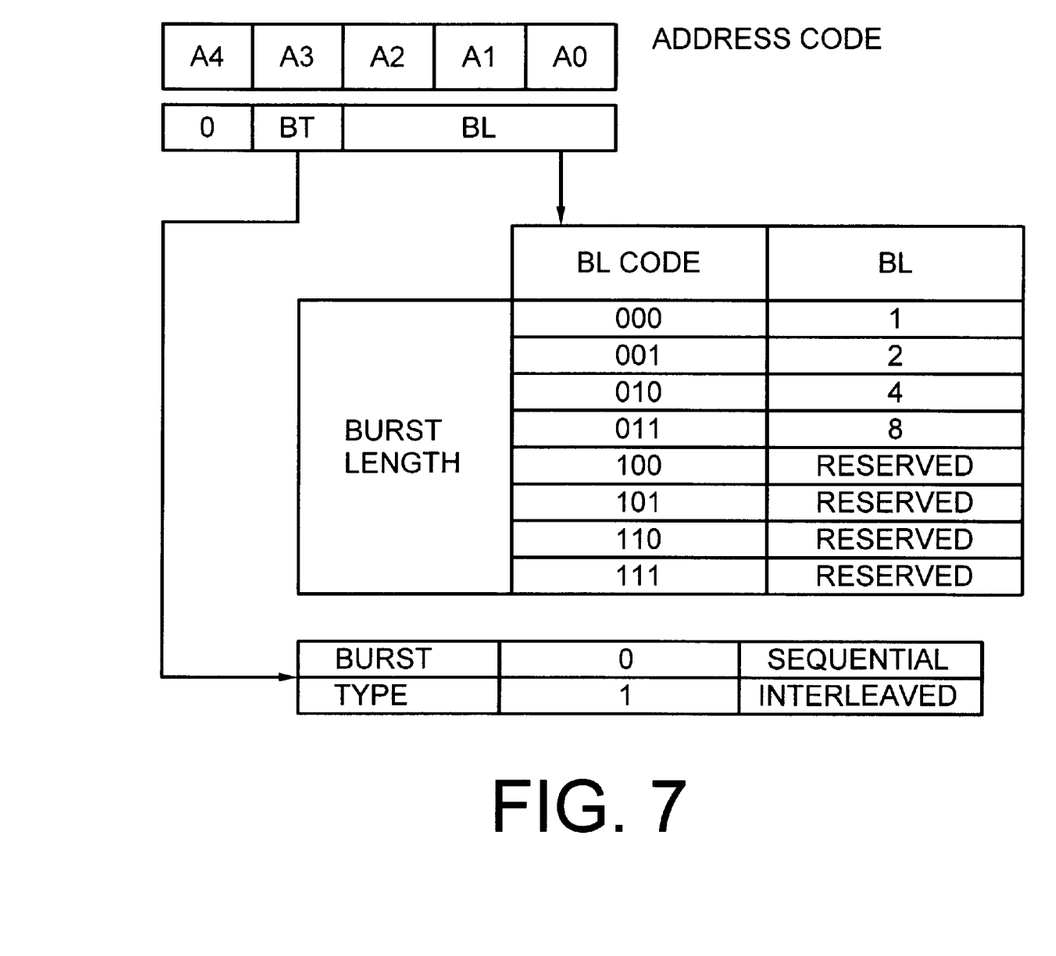
FIG. 7 is a truth table illustrating a mode register code.

As illustrated in FIG. 7, the MRC value is composed of bits A4 to A0. Bit A4 may be set to 0 and used as a reserved bit. Bit A3 may define a burst type (BT). For example, when the BT bit is set to 0, data transfer may be carried out in a sequential burst mode. When the BT bit is set to 1, an interleaved burst mode is selected.

Bits A2, A1 and A0 may be used as a 3-bit burst length (BL) code that defines the length of a data burst. For example, when the BL code is set to 000, burst length is equal to 1. When the BL code is set to 01, burst length is equal to 2, etc.

As discussed above, address signals at SRAM address pins ADA and ADB are used to select lines and words in the SRAM 16 during SRAM read and write accesses from ports A and B. In addition, signals at address pins ADA and ADB may represent load mask register commands LMRA and LMRB issued to supply mask data into the write per bit (WPB) mask registers 34 and 36, and byte write enable (BWE) mask register 46.

The WPB registers 34 and 36 arranged between data ports A and B, and the SRAM 16 are used to mask a portion of data being written from ports A and B to the SRAM 16. The BWE mask register 46 provided between the DRAM 12 and SRAM 16 may mask a byte of data being written from the SRAM 16 to the DRAM 12 in a DRAM masked transfer (DMT) mode. A masking system in the MPRAM 10 is disclosed in more detail in our copending application Ser. No. 09/006,119, entitled "MASKING SYSTEM IN A MULTI-PORT ROM" filed on Jan. 13, 1998 and incorporated herewith by reference.

The WPB registers 34 and 36 may be loaded with mask data from either port A or port B. The mask data are supplied via data pins DQA and DQB for loading from ports A and B, respectively.

To support load mask register operations, SRAM address pins ADA<3:0> may carry a 4-bit load mask register command LMRA, and SRAM address pins ADB may supply a 4-bit load mask register command LMRB. The LMRA command is issued when the WPB or BWE mask register is loaded from port A, whereas the LMRB command controls loading the WPB or BWE mask register from port B.

Logical value of the LMRA or LMRB command may indicate whether the WPB or WRE mask register is being loaded with mask data, and which bits of the mask register are selected for loading. For example, when the LMRA or LMRB command is set to 0000, the 16-bit WPB mask register 34 may be loaded with mask data, whereas the LMRA or LMRB command set to 0001 may request mask data to be written into the 16-bit WPB mask register 36. When the LMRA or LMRB command is set to 0010, mask data may be written into the lower byte of the BWE mask register 46. whereas the LMRA or LMRB command set to 0011 may request mask data to be written into the upper byte of the BWE mask register 46.

There, accordingly, has been described a multi-port memory chip having, a DRAM main memory and a SRAM cache memory coupled via a global bus. An addressing system enables the user to perform data transfers between external data ports and the SRAM concurrently with data transfers between the DRAM and the SRAM. To support DRAM operations, DRAM address pins on the memory chip select a data block in the DRAM, and indicates a SRAM line for receiving or transferring data. To support SRAM operations, SRAM address pins determine addressed line and word in the SRAM. To reduce the number of pins on the memory chip, the DRAM address pins and SRAM address pins are used for supplying commands that define various memory operations.

In this disclosure, there are shown and described only the preferred embodiments of the invention, but it is to be understood that the invention is capable of changes and modifications within the scope of the inventive concept as expressed herein.

What is claimed is:

1. A memory device comprising on a single chip:

multiple data ports for providing data input and output, a main memory for storing data, a cache memory coupled between said multiple data ports and said main memory and having a smaller storage capacity than said main memory, address pins arranged on said chip to provide address information for performing data transfer between said main memory and said cache memory independently of data transfer between said data port and said cache memory, said address pins including separate cache memory address pins arranged for each port of said multiple data ports for addressing the cache memory so as to support independent data transfer between said each port and said cache memory, said address pins being supplied with control values for providing commands to execute various operations, and main memory address pins for addressing the data transfer between said cache memory and said main memory.

2. The memory device of claim 1, wherein said main memory address pins are adapted to supply a precharge command for deactivating a single bank of said main memory.

3. The memory device of claim 1, wherein said main memory address pins are adapted to supply a precharge command for deactivating all banks of said main memory.

4. The memory device of claim 1, wherein said main memory address pins are adapted to define a main memory read transfer command for transferring a data block from said main memory to a line in said cache memory.

5. The memory device of claim 4, wherein said main memory address pins further provide a data block address signal for indicating the data block to be transferred from said main memory.

6. The memory device of claim 5, wherein said main memory address pins further provide a line address signal for indicating the line for receiving the data block from said main memory.

7. The memory device of claim 1, wherein said main memory address pins are adapted to define a main memory write transfer command for transferring data from a line in said cache memory to a data block in said main memory.

8. The memory device of claim 7, wherein said main memory address pins further provide a line address signal for indicating the line, from which data is transferred.

9. The memory device of claim 8, wherein said main memory address pins further provide a data block address signal for indicating the data block selected for receiving the data from the cache memory.

10. The memory device of claim 1, wherein said main memory address pins are adapted to define a main memory masked transfer command for masking a byte of data transferred data from said cache memory to said main memory.

11. The memory device of claim 1, wherein said main memory address pins are adapted to define an auto-refresh command for refreshing a row of said main memory.

12. The memory device of claim 1, wherein said main memory address pins are adapted to provide a set mode register command for supplying type and length of a data burst in a burst mode of operation.

13. The memory device of claim 1 further comprising a byte write enable mask register arranged between said main memory and said cache memory for masking data being transferred between said main memory and said cache memory.

14. The memory device of claim 13 further comprising a write per bit mask register arranged between said data port and said cache memory for masking data being transferred between said data port and said cache memory.

15. The memory device of claim 14, wherein said cache memory address pins are adapted to provide a load mask register command for loading mask data into said byte write enable mask register and said write per bit mask register.

16. The memory device of claim 15, wherein said load mask register command indicates whether said byte write enable mask register or said write per bit mask register is selected for loading with the mask data.

17. The memory device of claim 16, wherein said load mask register command further indicate a portion in said byte write enable mask register and write per bit mask register to be loaded with the mask data.

18. The memory device of claim 1, wherein said cache memory address pins comprise separate pins for initiating mask data loading from different data ports.

* * * * *